(12) United States Patent
Hojat et al.

(10) Patent No.: US 6,789,245 B2
(45) Date of Patent: Sep. 7, 2004

(54) USE OF COUPLING CAPACITANCE TO BALANCE SKEW IN A NETWORK

(75) Inventors: Shervin Hojat, Austin, TX (US); David Hogenmiller, Cedar Park, TX (US); Harsh Sharma, Austin, TX (US)

(73) Assignee: Sun Microsystems, Inc., Santa Clara, CA (US)

( * ) Notice: Subject to any disclaimer, the term of this patent is extended or adjusted under 35 U.S.C. 154(b) by 121 days.

(21) Appl. No.: 10/267,336

(22) Filed: Oct. 8, 2002

(65) Prior Publication Data

US 2004/0068709 A1 Apr. 8, 2004

(51) Int. Cl.⁷ .............................. G06F 17/50; G06F 9/45
(52) U.S. Cl. ................... 716/10; 716/9; 716/8; 716/12
(58) Field of Search .................... 716/10, 1–9, 11–15

(56) References Cited

U.S. PATENT DOCUMENTS

| | | | | |
|---|---|---|---|---|
| 5,309,015 A | * | 5/1994 | Kuwata et al. | 257/659 |
| 6,081,022 A | * | 6/2000 | Mitra et al. | 257/630 |
| 6,708,314 B2 | * | 3/2004 | Trivedi et al. | 716/2 |
| 2004/0046588 A1 | * | 3/2004 | Tetelbaum | 326/39 |

OTHER PUBLICATIONS

Boese, K. and Kahng, K., "Zero–Skew Clock Routing Trees With Minimum Wirelength", IEEE, 0–7803–0768–2, 1992, pp. 17–21.

Cong, J., Kahng, A.B., Koh, C. –K., Tsao, C. –W.A., "Bounded–Skew Clock and Steiner Routing Under Elmore Delay", Proceedings ACM/IEEE International Conference on Computer–Aided Design, Nov. 1995, pp. 66–71.

Cong, J., Kahng, A.B., Koh, C. –K., Tsao, C. –W.A., "Bounded–Skew Clock and Steiner Routing", ACM Transactions on Design Automation of Electronic Systems, vol. 3, No. 3, Jul. 1998, pp. 341–388.

* cited by examiner

*Primary Examiner*—A. M. Thompson
*Assistant Examiner*—Magid Y. Dimyan
(74) *Attorney, Agent, or Firm*—Gunnison, McKay & Hodgson, L.L.P.; Lisa A. Norris

(57) ABSTRACT

Coupling capacitance is used to balance skew in a network. In one embodiment, the coupling capacitance exerted by shielding wires oppositely adjacent one or more signal wires in a network is utilized to vary the speed of a signal carried on the one or more signal wires to balance skew in the network.

11 Claims, 8 Drawing Sheets ic. As a result, more
USE OF COUPLING CAPACITANCE TO BALANCE SKEW IN A NETWORK

BACKGROUND OF THE INVENTION

1. Field of the Invention

The present invention relates generally to electronic component design and, more particularly, to alteration of signal speed on a network signal wire in order to balance skew in the network.

2. Description of Related Art

Currently, most mainstream electronic components and systems, such as microprocessors, are synchronous systems employing one or more system clocks that act as the driving force or "heart" of the electronic system. As a result, more often than not, it is critical that a given system clock signal arrive at various points in the system at nearly the same time. As discussed below, this situation can create significant complications in microprocessor design.

FIG. 1 illustrates a portion of a length of signal wire 100 including, from left to right, in the direction shown by arrow 120, points 102, 104 and 106. As is well known, the physics of conductors and wave propagation dictate two precepts: first, the absolute speed limit for any signal moving from point 102 to points 104 or 106 is the speed of light; second, since wire 100 is typically a metallic conductor, with an inherent resistance, a signal propagating in wire 100 actually travels at a speed significantly less than the speed of light.

As a result of these physical limitations on the speed at which a signal can propagate through wire 100, it follows that the greater the distance between two points on/in wire 100, the longer it takes the signal to reach the point. Consequently, a signal traveling from point 102, in the direction shown by arrow 120, will take less time to reach point 104, i.e., travel distance 108, than it will take to reach point 106, i.e., travel distance 108 and distance 110; and thus, there is a time delay between when the signal reaches point 104 and when it reaches point 106. In addition, as can be seen from the discussion above, as long as wire 100 has a reasonably consistent composition and the wire lies on the same metal layer, the time delay is typically proportional to the distance traveled, i.e., twice the distance results in approximately four times the delay.

Typically there are numerous circuit components, located at different distances from the system clock(s) that must receive the clock signal at the same time over interconnecting signal wires. Given the discussion above with respect to FIG. 1, it can be understood that the problem of ensuring a given clock signal is received at a first point and at other variously distanced points, nearly simultaneously, is significant.

One prior art method used to ensure the receipt of a clock signal at the same time at variously distanced points, was to introduce a time delay on the shorter signal paths by forming serpentine signal paths. The introduction of a time delay, also called simply a "delay", between when one point receives a signal and when a second point, that should receive the signal at the same time, actually receives the signal, is known as skew. When the signal is a clock signal, then it is known as clock skew. Serpentining the signal wire between close points increased the actual length of the signal path over the original distance between the points, and delayed the signal so that the signal arrived at the more distant point at the same time as the close points. Conventionally, serpentining a signal wire involves routing the signal wire in vertical and horizontal directions on the same microprocessor layer using wire jogs.

Although a select signal, such as a clock signal, may need to be delayed in route to a particular component in order to balance skew in the network, optimizing the signal speed in the device is still important in order for the device to remain competitive in the market. To aid in maintaining the integrity and speed of a signal carried on a signal wire, shielding wires are often routed to each side of the signal wire to reduce the effects of electrical noise on the signal wire from other components and signals in the device that can disrupt and delay a signal on the signal wire.

Conventionally, shielding wires are offset a predetermined offset distance from the signal wire to minimize interactions between the shielding wires and the signal wire that could disrupt or delay a signal. Particularly, the shielding wires are positioned at an offset distance to minimize interactions, such as capacitive coupling, between the shielding wires and the signal wire which can result in increased noise and delay on the signal wire. When a signal wire has a serpentine path, typically, the shielding wires follow the serpentine pattern, as needed, at the specified offset distance from the signal wire.

FIG. 2 illustrates a microprocessor clock network having two signal paths issuing from a clock signal source, in which the shorter signal path has a time delay introduced into it by serpentining the signal path. In FIG. 2, microprocessor layer 210 includes clock source 212 that sends clock signals over branched signal wire 220 to two components 214 and 216. Component 214 is located a distance D1 from clock source 212 directly off of signal wire 220 that is shielded by shielding wires 222 and 224. Component 216, however, is located a shorter distance D2 from clock source 212 indirectly off of signal wire 220, namely, off of a portion of signal wire 220 and branch signal wires 230 and 240, and shielded by shielding wires 232 and 234 and shielding wires 242 and 244, respectively. As distance D1 is larger than distance D2, component 214 is farther from clock source 212 than component 216 resulting in a clock skew, e.g., a signal will take longer to reach component 214 than component 216. To ensure the clock signal arrives at both components 214 and 216, nearly simultaneously, signal wire branch 240 is serpentined to increase the actual distance of the signal path to component 216. Thus, the actual signal path length along signal wire branch 240 is longer so as to delay the transit time of a signal to component 216 and balance the clock skew in the network.

While this technique enables the clock signal to arrive at different components, nearly simultaneously, the more complex signal and shielding wire routings can increase the design and process complexity as well as processing time and costs.

SUMMARY OF THE INVENTION

According to the principles of this invention, methods and devices for using the coupling capacitance of shielding wires to balance skew in a network are described.

According to one embodiment of the present invention, a method for balancing skew in a network includes: designating a first signal wire in a network, the first signal wire communicatively coupling a sending component with a first receiving component, the first receiving component being located along the first signal wire a first distance from the sending component, the first signal wire carrying a signal sent from the sending component to the first receiving component; designating a second signal wire in the network, the second signal wire communicatively coupling the sending component with a second receiving component, the second receiving component being located along the second signal wire a second distance from the sending component, the second distance being less than the first distance, the second signal wire carrying the signal sent from the sending component to the second receiving component; positioning first and second shielding wires oppositely adjacent the first signal wire at a first offset distance, the first and second shielding wires exerting a first capacitive coupling effect on the first signal wire; positioning third and fourth shielding wires oppositely adjacent the second signal wire at a second offset distance, the third and fourth shielding wires exerting a second capacitive coupling effect on the second signal wire that is greater than the first capacitive effect on the first signal wire such that the signal arrives at the first and second receiving components at nearly the same time.

In another embodiment, a device including a network in which the skew is balanced utilizing coupling capacitance includes: at least one sending component, the at least one sending component for sending a signal over a signal wire to one or more receiving components in a network; a first receiving component communicatively coupled to the at least one sending component by a first signal wire, the first receiving component being located a first distance along the first signal wire from the at least one sending component in the network; a second receiving component communicatively coupled to the at least one sending component by a second signal wire, the second receiving component being located a second distance along the second signal wire from the at least one sending component in the network, wherein in the second distance is less than the first distance; a first pair of shielding wires positioned oppositely adjacent the first signal wire at a first offset distance, the first pair of shielding wires for effecting a first capacitive coupling of a signal carried on the first signal wire; a second pair of shielding wires positioned oppositely adjacent the second signal wire at a second offset distance smaller than the first offset distance, the second pair of shielding wires for effecting a second capacitive coupling of the signal carried on the second signal wire greater than the first capacitive coupling of the signal carried on the first signal wire, such that the signal is received at the first and second receiving components at nearly the same time.

In a further embodiment, a method for utilizing coupling capacitance to balance skew in a network includes: designating a first signal path in a network, the first signal path for carrying a signal from a sending component to a first receiving component in the network; designating a second signal path in the network, the second signal path for carrying the signal from the sending component to a second receiving component in the network, the second signal path being shorter in distance than the first signal path; and effecting a first capacitive coupling effect on the first signal path and a greater second capacitive coupling effect on the second signal path, so that a signal carried on the first and second signal paths arrive at the first and second receiving components nearly simultaneously and balance skew in the network.

In some embodiments, effecting a first capacitive coupling effect on the first signal path further includes: positioning first and second shielding wires oppositely adjacent the first signal path at a first offset distance. In some embodiments, effecting a second capacitive coupling effect on the second signal path further includes: positioning third and fourth shielding wires oppositely adjacent the second signal path at a second offset distance, the second offset distance being less than the first offset distance.

As a result of these and other features discussed in more detail below, methods and devices designed according to the principles of the present invention permit skew in a network to be balanced by varying the speed of a signal in a signal wire utilizing the coupling capacitance of shielding wires oppositely adjacent the signal wire. The present invention does not require the processing complexity and costs associated with the prior art technique earlier described.

It is to be understood that both the foregoing general description and the following detailed description are intended only to exemplify and explain the invention as claimed.

BRIEF DESCRIPTION OF THE DRAWINGS

The accompanying drawings, which are incorporated in, and constitute a part of this specification illustrate embodiments of the present invention, and together with the description, serve to explain the principles of the invention.

In the drawings.

DETAILED DESCRIPTION

The present invention provides methods and devices in which the coupling capacitance of shielding wires on associated signal wires is used to balance skew in a network. The amount of coupling capacitance effected by a shielding wire on a signal in a signal wire varies as a function of the offset distance of the shielding wire from the signal wire. Offset distances closer to the signal wire permit a higher coupling capacitance and slow the signal to a greater degree relative to offset distances farther away from the signal wire. In one embodiment, the offset distance is varied by changing the position of the shielding wires. In another embodiment, the offset distance is varied by changing the wire width of the shielding wires. The present invention utilizes the coupling capacitance of the shielding wires to balance skew in the network while not requiring the processing complexity and costs associated with the prior art techniques earlier described.

The present invention is described herein with reference to a microprocessor clock network, such as an H-clock network, however, it can be appreciated by those of skill in the art that the present invention is not limited to microprocessor clock networks, but is applicable to other types of networks as well.

Figure 1:
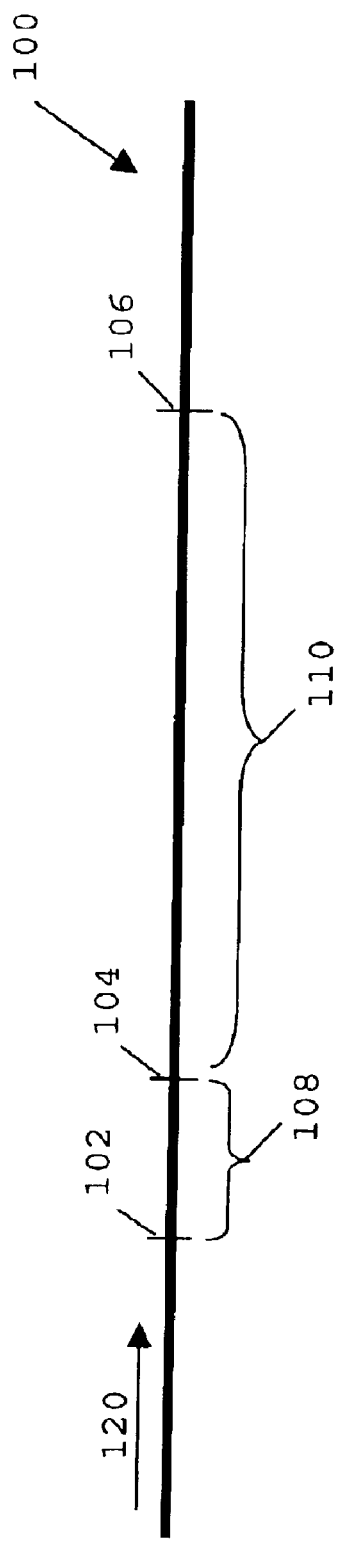
FIG. 1 illustrates a portion of a length of signal wire 100 including, from left to right, in the direction shown by arrow 120, points 102, 104 and 106.
Figure 2:
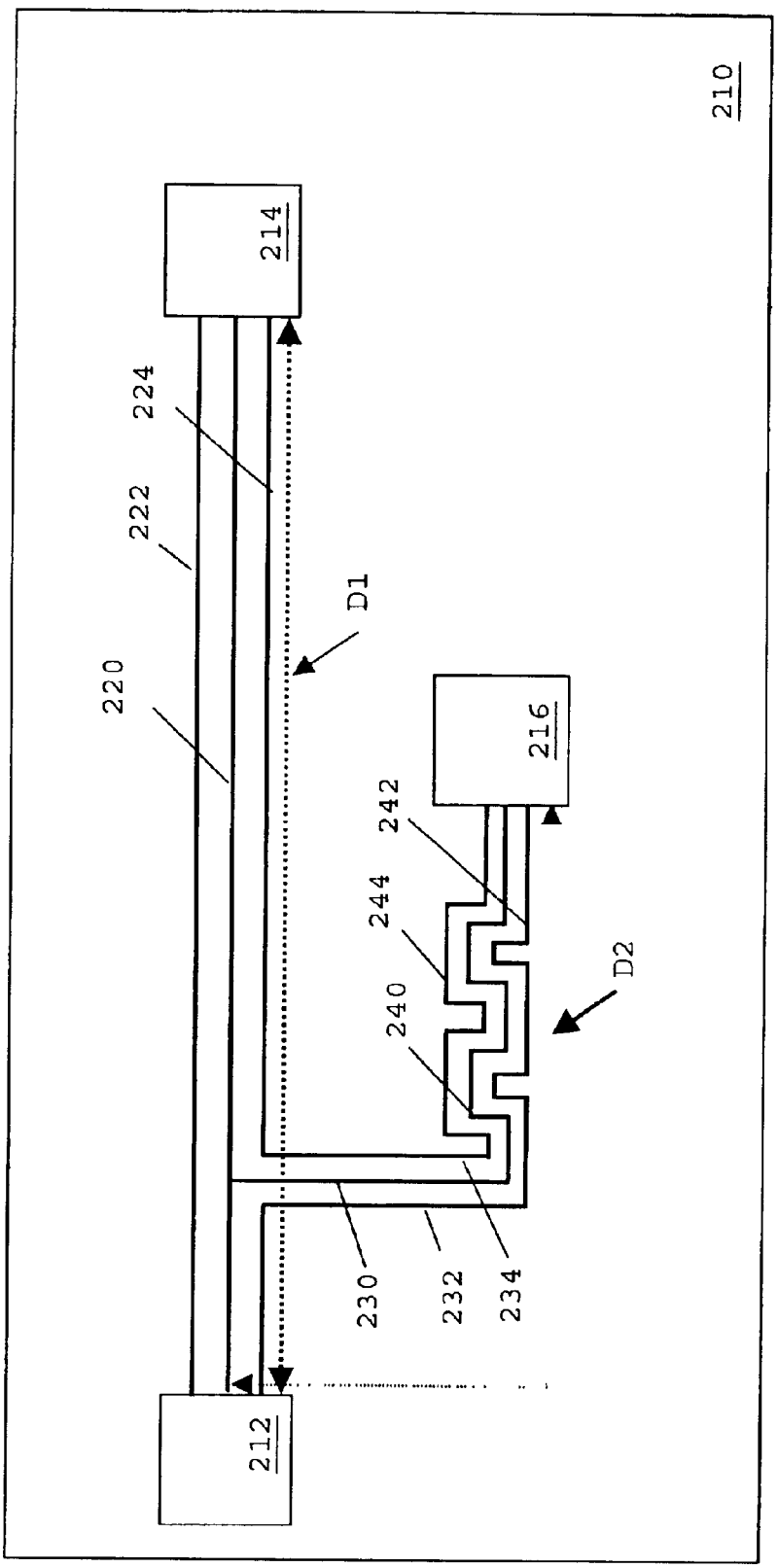
FIG. 2 illustrates a microprocessor clock network having two signal paths issuing from a clock signal source, in which the shorter signal path has a time delay introduced into it by serpentining the signal path.
Figure 3:
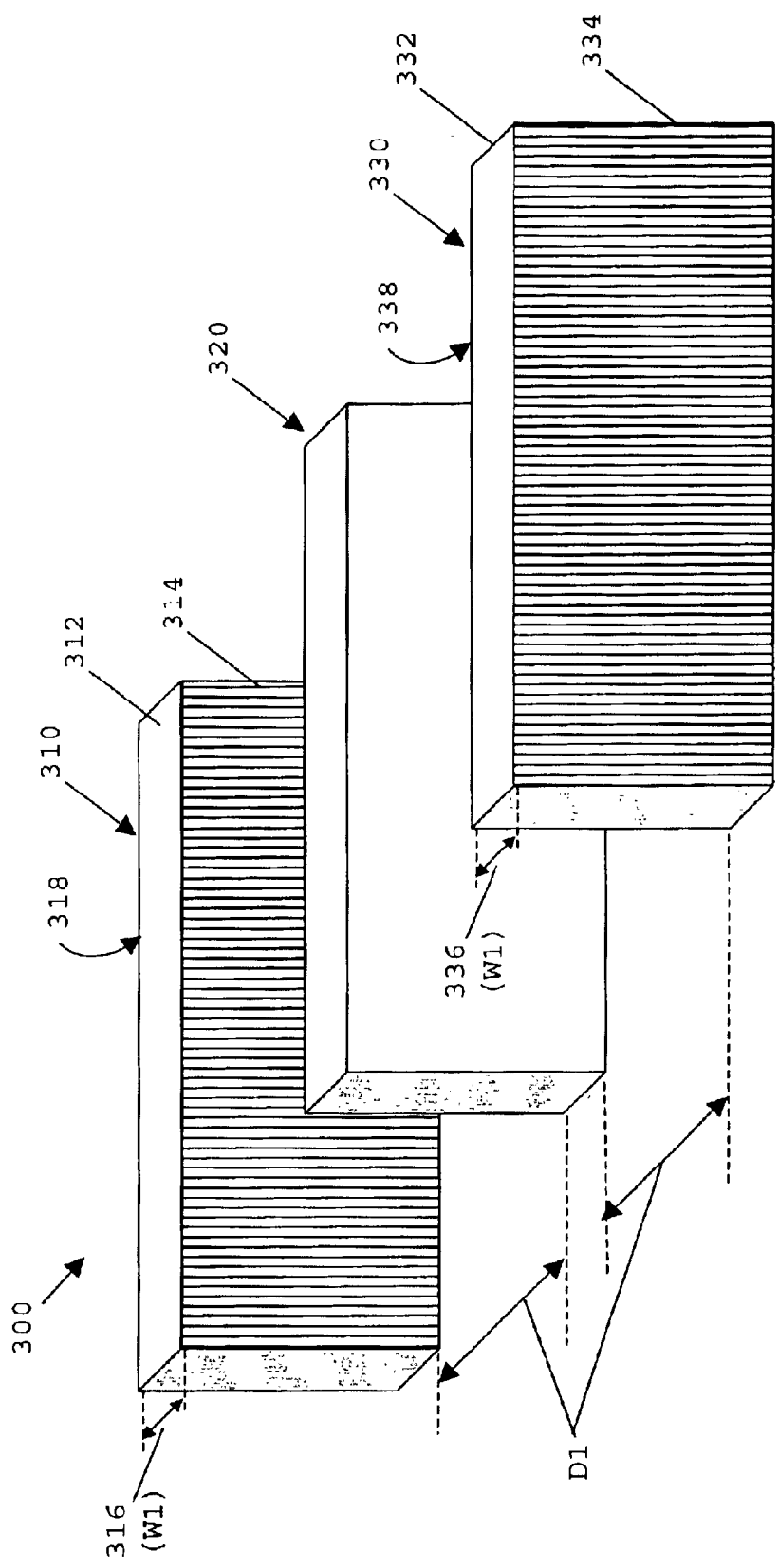
FIG. 3 illustrates a general diagram of a microprocessor layer in which the coupling capacitance of shielding wires at an offset distance D1 is used to adjust the speed of a signal carried on a signal wire in a network according to one embodiment of the present invention.
Figure 4:
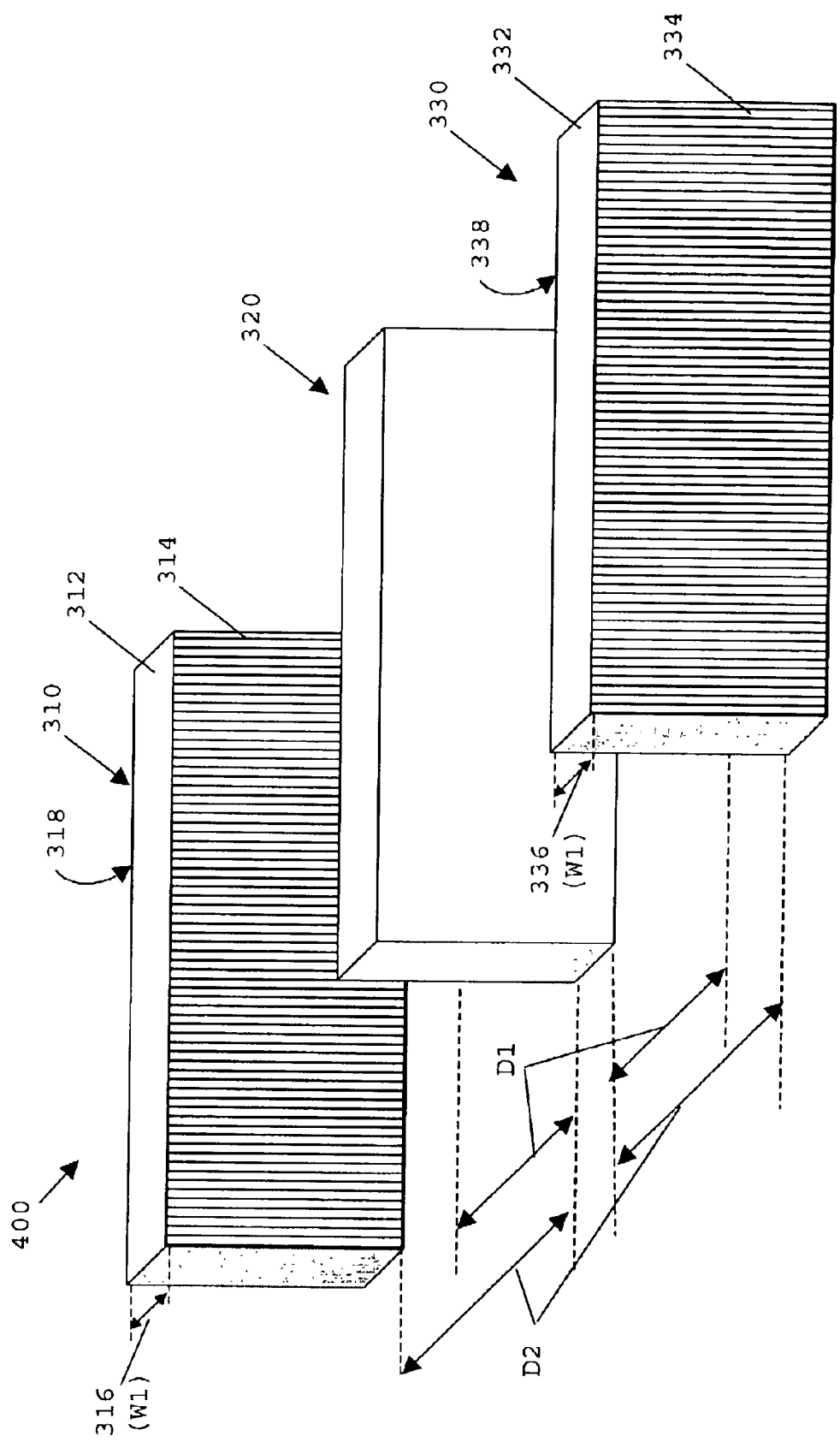
FIG. 4 illustrates a general diagram of a microprocessor layer in which the shielding wires are repositioned at an offset distance D2 from the signal wire to increase the speed of a signal carried on the signal wire relative to that at offset distance D1 of FIG. 3 according to one embodiment of the present invention.
Figure 5:
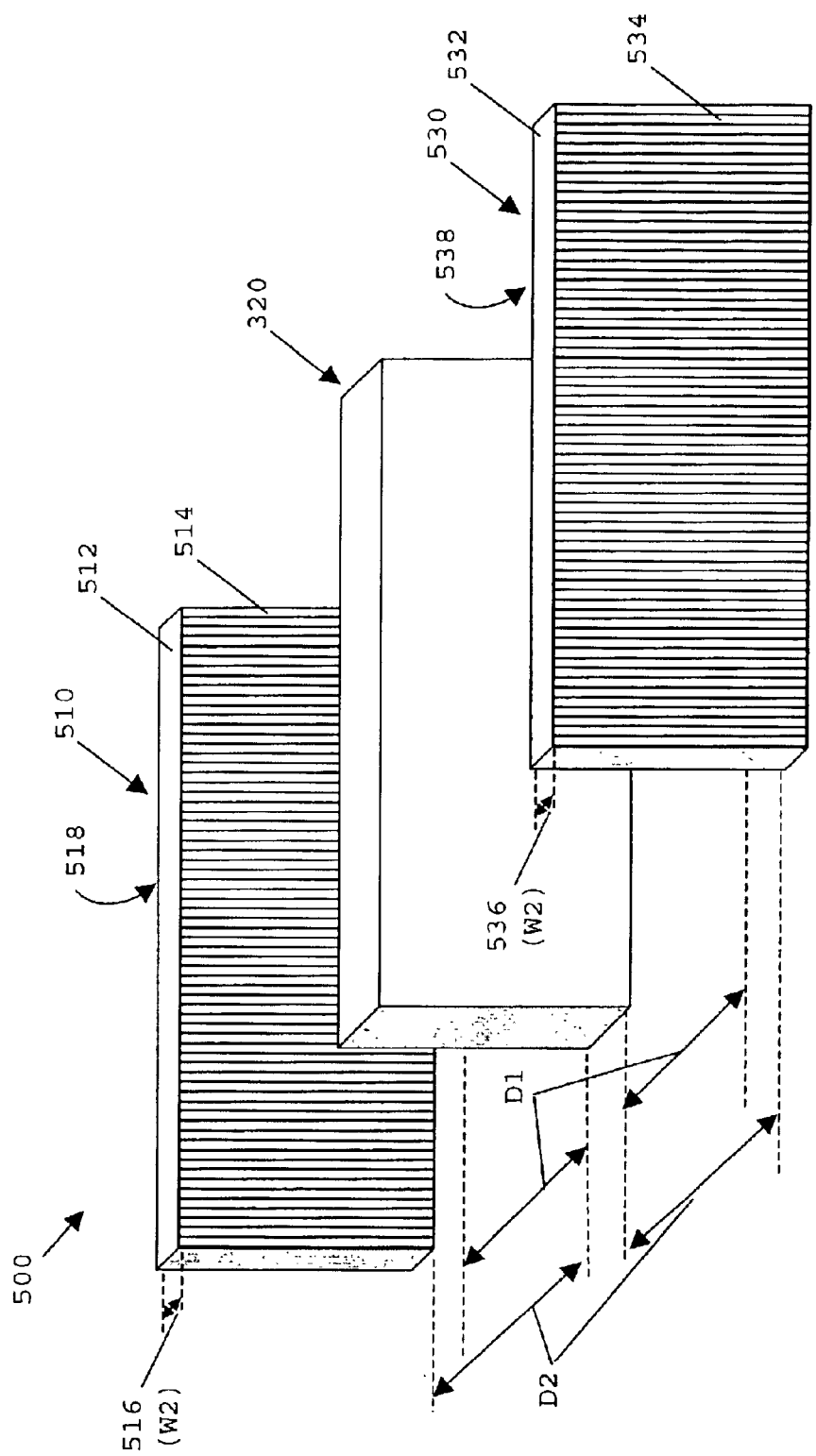
FIG. 5 illustrates a general diagram of a microprocessor layer in which the offset distance from a signal wire is increased by decreasing the width of the shielding wires according to another embodiment of the present invention.
Figure 6:
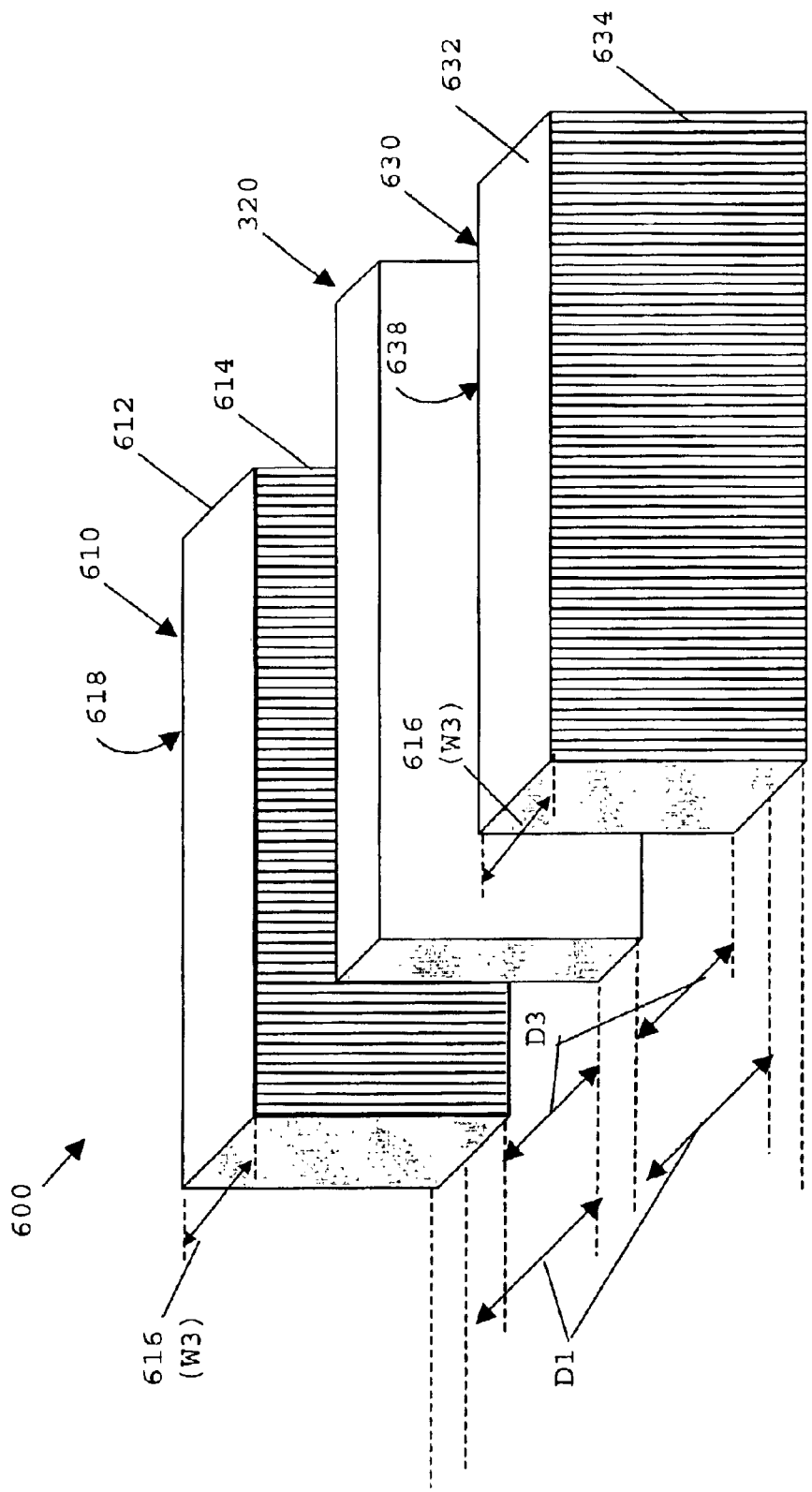
FIG. 6 illustrates a general diagram of a microprocessor layer in which the offset distance from a signal wire is decreased by increasing the width of the shielding wires according to another embodiment of the present invention.

FIGS. 3 and 4 illustrate general diagrams of portions of a microprocessor layer in which the offset distance of opposite, adjacent shielding wires are adjusted to vary the speed of a signal carried on a signal wire in a network by adjusting the position of the shielding wires. In the context of the present invention, the term offset distance refers to the distance between the interior sidewalls of a signal wire and an adjacent shielding wire; however, it can be appreciated by those of skill in the art that the distancing of the signal wire and adjacent shielding wires can also be expressed in other ways, such as by a shield pitch, e.g., the distance between the center lines of a shielding wire and a signal wire. FIGS. 5 and 6 illustrate general diagrams of portions of a microprocessor layer in which the offset distance of opposite adjacent shielding wires are adjusted to vary the speed of a signal carried on a signal wire in a network by changing the shielding wire widths.

FIG. 3 illustrates a general diagram of a microprocessor layer 300 in which the coupling capacitance of shielding wires at an offset distance D1 is used to adjust the speed of a signal carried on a signal wire in a network according to one embodiment of the present invention. For clarity of description, the portions of shielding wires 310 and 330, and signal wire 320 shown in FIG. 3 are isolated from the layer components (not shown) to more easily present the principles of the present invention. For example, signal wire 320 can interconnect a sending component (not shown), such as a clock source, and a receiving component (not shown), and can carry a signal, such as a clock signal. Shielding wires 310 and 330 are positioned oppositely, adjacent signal wire 320. Shielding wire 310 has a top face 312 of wire width 316 (W1) and sidewalls 314 and 318. Shielding wire 330 has a top face 332 of wire width 336 and sidewalls 334 and 338. Shielding wires 310 and 330 are offset from signal wire 320 an offset distance D1. At offset distance D1, shielding wires 310 and 330 effect a coupling capacitance on a signal traveling in signal wire 320 of a particular amount. This coupling capacitance is primarily effected on the signal in signal wire 320 through sidewalls 314 and 338 of shielding wires 310 and 330, and, secondarily, through top faces 312 and 332. As is well-known to those of skill in the art, coupling capacitance increases as an aggressor wire, e.g., the shielding wires, is moved closer to a victim wire, e.g., the signal wire, thus the signal slows as the offset distance decreases. Conversely, coupling capacitance decreases as an aggressor wire is moved farther from a victim wire, thus the signal speeds up as the offset distance decreases, e.g., is less delayed.

In a network, increasing or decreasing the offset distance D1 of shielding wires 310 and 330 from signal wire 320 speeds or slows the signal in signal wire 320 relative to other signals traveling on other signal wires having different offset distances.

FIG. 4 illustrates a general diagram of a microprocessor layer 400 in which the shielding wires are repositioned at an offset distance D2 from the signal wire in the network to increase the speed of a signal carried on the signal wire relative to that at offset distance D1 of FIG. 3 according to one embodiment of the present invention. In FIG. 4, shielding wires 310 and 330 are repositioned at an offset distance D2 away from signal wire 320, where offset distance D2 is larger than offset distance D1 of FIG. 3. Increasing the offset distance from signal wire 320, reduces the coupling capacitance effected by shielding wires 310 and 320 on a signal in signal wire 320. Thus, the speed of a signal in signal wire 320 of FIG. 4 is greater relative to the speed of a signal in signal wire 320 of FIG. 3. In a network, such as a clock network, the present invention can be used to slow signals to components close to a clock signal source relative to signals to components farther from the clock signal source.

The above examples have illustrated one embodiment of the present invention in which the offset distance, and thus the capacitive coupling effect, of a shielding wire and a signal wire is varied by changing the position of the shielding wire while the shielding wire width remains unchanged. In another embodiment of the invention, the offset distance of a shielding wire from a signal wire is varied by changing the width of the shielding wire rather than the position of the entire shielding wire.

FIG. 5 illustrates a general diagram of a microprocessor layer 500 in which the offset distance from a signal wire is increased by decreasing the width of the shielding wires according to another embodiment of the present invention. In FIG. 5, in one embodiment, shielding wires 510 and 530 are positioned at the locations of shielding wires 310 and 330 of FIG. 3. However, to reduce the coupling capacitance on signal wire 320, the widths of shielding wires 510 and 530 are reduced to a smaller wire width W2 relative to width W1 of FIG. 3. By decreasing the widths, the shielding wires 510 and 530 are now located at an offset distance D2 that is greater than offset distance D1 of FIG. 3. Increasing the offset distance reduces the coupling capacitance effect of shielding wires 510 and 530 on a signal in signal wire 320, such that the signal travels faster relative to a signal traveling on signal wire 320 of FIG. 3.

FIG. 6 illustrates a general diagram of a microprocessor layer 600 in which the offset distance from a signal wire is decreased by increasing the width of the shielding wires according to another embodiment of the present invention. In FIG. 6, in one embodiment, shielding wires 610 and 630 are positioned at the locations of shielding wires 310 and 330 of FIG. 3. However, to increase the coupling capacitance on signal wire 320, the widths of shielding wires 610 and 630 are increased to a larger width W3 relative to width W1 of FIG. 3. By increasing the widths, the shielding wires 610 and 630 are now located at an offset distance D3 that is smaller than offset distance D1 of FIG. 3. Decreasing the offset distance increases the coupling capacitance effect of shielding wires 610 and 630 on a signal in signal wire 320, such that the signal travels slower relative to a signal traveling on signal wire 320 of FIG. 3.

Figure 7:
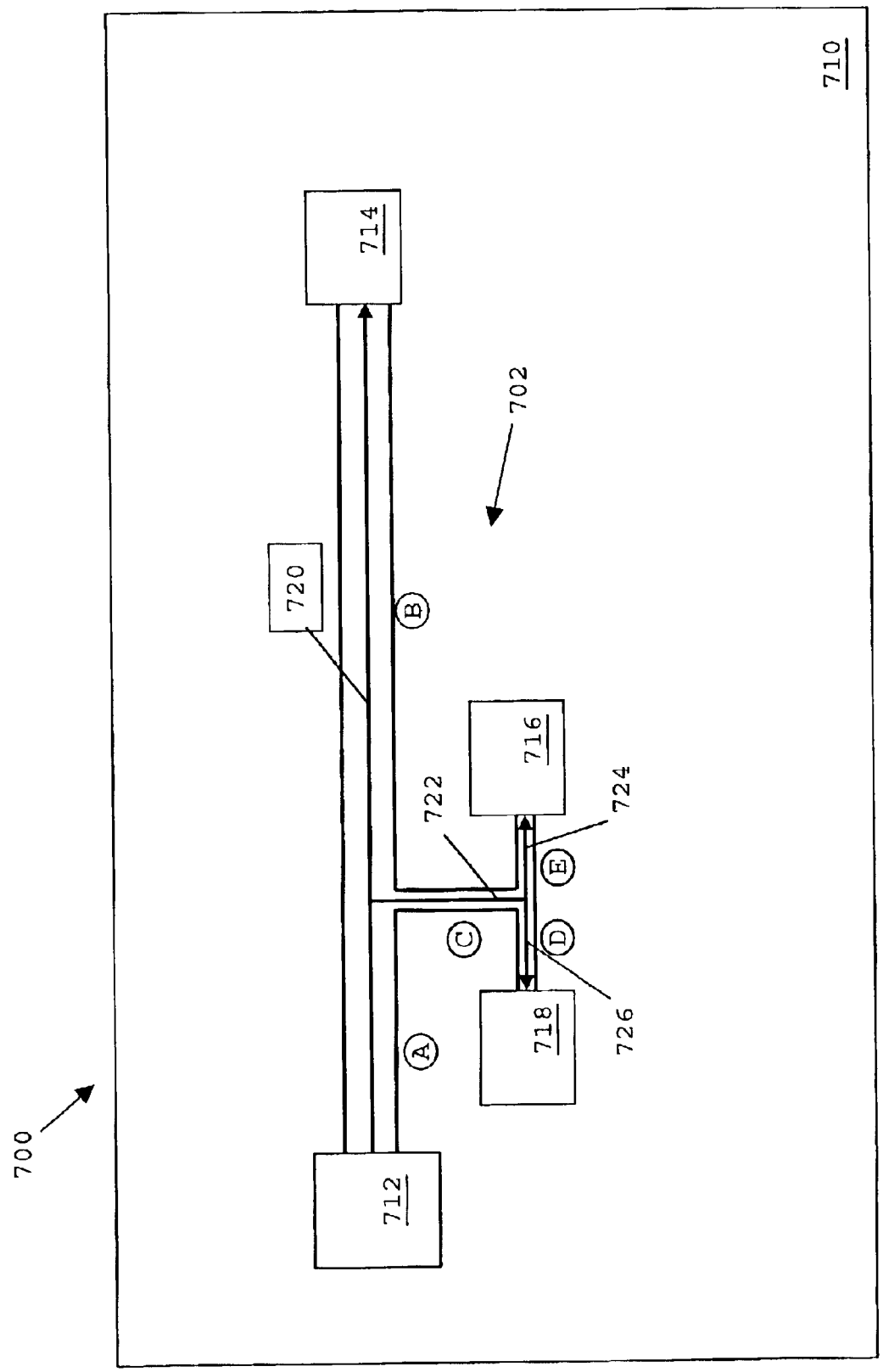
FIG. 7 illustrates a block diagram of a layer of a microprocessor device including a network in which the coupling capacitance of shielding wires is used to balance skew in the network according to one embodiment of the present invention.
Figure 8:
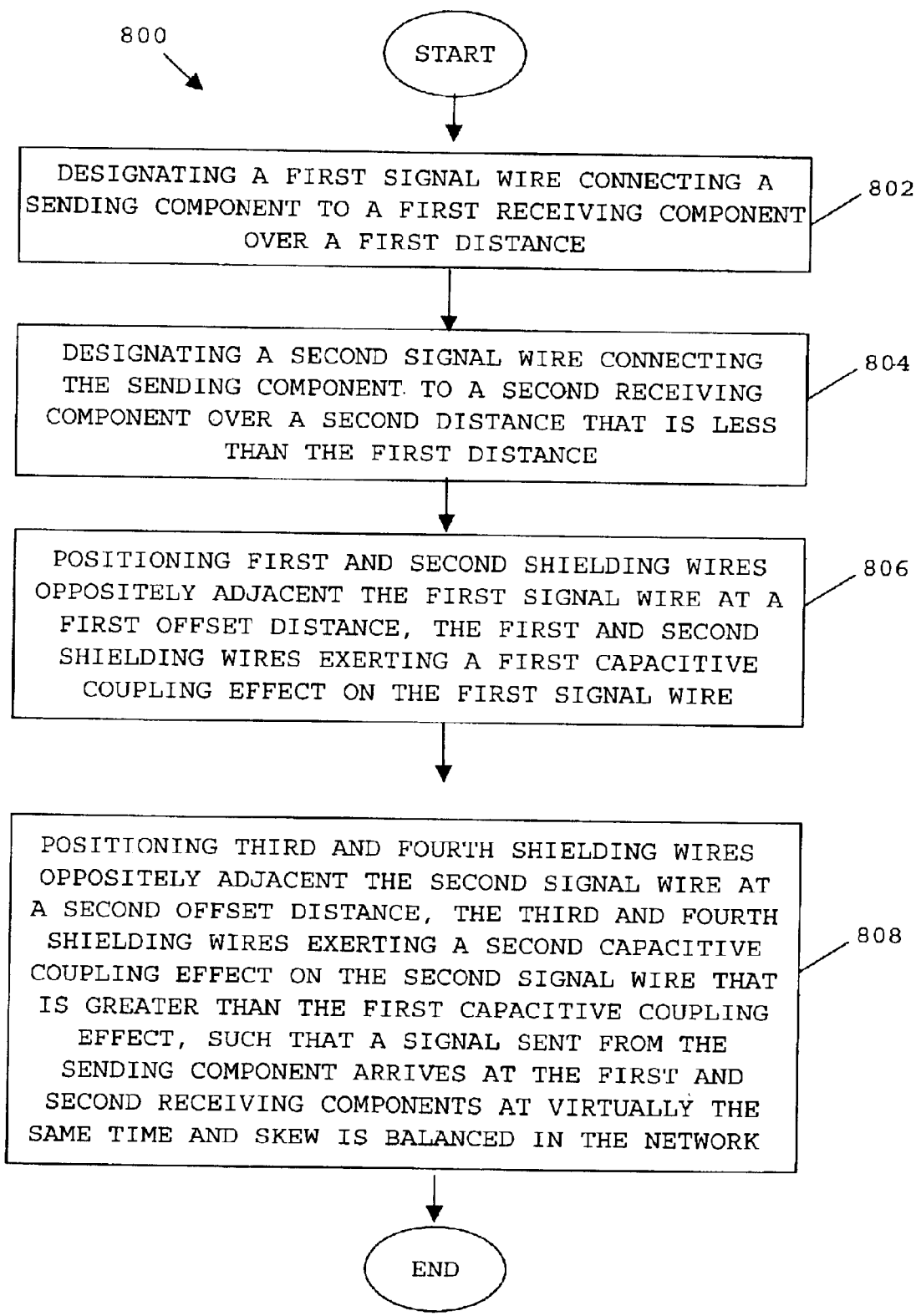
FIG. 8 illustrates a process diagram of a method for utilizing coupling capacitance to balance skew in a network according to one embodiment of the present invention.

FIGS. 7 and 8 are now described to illustrate utilization of coupling capacitance to balance skew in a network. FIG. 7 illustrates a block diagram of a layer of a microprocessor device 700 including a network 710 in which the coupling capacitance of shielding wires is used to balance skew in the network according to one embodiment of the present invention. According to FIG. 7, in one embodiment, microprocessor device 700 is illustrated having at least one layer 710 including a network 702 in which the skew, such as clock skew, of a signal generated by a sending component 712, such as clock signal generator, is balanced to the receiving components 714, 716, and 718, by varying the offset distance of shielding wires oppositely adjacent the signal wires to the receiving components.

By varying the offset distances of the shielding wires from the signal wires, the capacitive coupling between the shielding wires and the signal wires is varied, thus varying the speed of a signal carried on the signal wires. For example, sending component 712 can be a clock signal source that sends signals over signal wire 720 and its branch signal wires 722, 724 and 726 to receiving components 714, 716, and 718. In one embodiment, clock signals traveling to receiving components 714, 716 and 718 are delayed or sped up, relative to the others, by adjusting the offset distance of the shielding wires from the signal wire along some or all of the shielding wire segments A, B, C, D, and E so that the clock skew to the receiving components is balanced. For example, as illustrated in FIG. 7, shielding wire segments C, D, and E oppositely adjacent signal wire branches 722, 724 and 726 are positioned at a closer offset distance relative to the offset distance of the shielding wires segments A and B oppositely adjacent signal wire 722. Thus, the speed of a signal to receiving components 716 and 718 is slower relative to the speed of a signal to receiving component 714 due to the increased coupling capacitance effected by the shielding wires on the signal wires.

FIG. 8 illustrates a process diagram of a method for utilizing coupling capacitance to balance skew in a network according to one embodiment of the present invention. According to FIG. 8, in one embodiment, at operation 802, a first signal wire is designated in a network. The first signal wire connects a sending component to a first receiving component over a first signal path of a first distance. For example, referring to FIG. 7, signal wire 720 forms a first signal path that connects sending component 712 to receiving component 714 over a first distance.

Returning to FIG. 8, at operation 804, a second signal wire is designated in the network. The second signal wire connects the sending component to a second receiving component over a second signal path of a second distance that is less than the first distance. For example, referring to FIG. 7, a portion of signal wire 720 together with signal wire branches 722 and 724 form a second signal path that connects sending component 712 to receiving component 716 over a second distance that is smaller than the first distance.

Returning to FIG. 8, at operation 806, first and second shielding wires are positioned oppositely adjacent the first signal wire at a first offset distance. The first and second shielding wires exerting a first capacitive coupling effect on the first signal wire. For example, referring to FIG. 7, shielding wires oppositely adjacent signal wire 720 along segments A and B are positioned at a first offset distance from signal wire 720 and exert a capacitive coupling effect on signal wire 720.

Returning to FIG. 8, at operation 808, third and fourth shielding wires are positioned oppositely adjacent the second signal wire at a second offset distance such that the second capacitive coupling effect exerted on the second signal wire is greater than the first capacitive coupling effect on the first signal wire so that a signal sent from the sending component arrives at the first and second receiving components at nearly the same time, and skew is balanced in the network. For example, referring to FIG. 7, shielding wires oppositely adjacent branch signal wires 722 and 724 are positioned at a second offset distance that is smaller than the first offset distance of shielding wires oppositely adjacent signal wire 720. As earlier described with reference to FIGS. 3 through 6, offset distances closer to a signal wire exert a greater capacitive coupling effect on the signal wire than offset distances father away from the signal wire. Thus, in FIG. 7, the closer second offset distance of the shielding wires adjacent signal wire branches 722 and 724 permit a larger capacitive coupling effect to be realized and the signal to be slowed relative to the signal carried on signal wire 720. In this way, the speed of the signal sent from sending component 712 can be balanced in the network so that the signal arrives nearly simultaneously at the receiving components 714 and 716. It can be appreciated that method 800 can be further applied to the signal sent to component 718, so that the speed of the signal to receiving components 714, 716 and 718 is balanced in the network.

As a result of these and other features discussed in more detail above, the present invention provides methods and devices for balancing skew in a network utilizing coupling capacitance, without the drawbacks of the prior art technique. Consequently, devices designed according to the principles of the present invention permit less complex and less costly network skew balancing.

The foregoing descriptions of implementations of the present invention have been presented for purposes of illustration and description, and therefore are not exhaustive and do not limit the invention to the precise forms disclosed. Modifications and variations are possible in light of the above teachings or can be acquired from practicing the invention. Consequently, the scope of the invention is defined by the claims and their equivalents.

What is claimed is:

1. A method for balancing skew in a network, the method comprising:
    designating a first signal wire in a network, the first signal wire communicatively coupling a sending component with a first receiving component, the first receiving component being located along the first signal wire a first distance from the sending component, the first signal wire carrying a signal sent from the sending component to the first receiving component;
    designating a second signal wire in the network, the second signal wire communicatively coupling the sending component with a second receiving component, the second receiving component being located along the second signal wire a second distance from the sending component, the second distance being less than the first distance, the second signal wire carrying the signal sent from the sending component to the second receiving component;
    positioning first and second shielding wires oppositely adjacent the first signal wire at a first offset distance, the first and second shielding wires exerting a first capacitive coupling effect on the first signal wire; and
    positioning third and fourth shielding wires oppositely adjacent the second signal wire at a second offset distance, the third and fourth shielding wires exerting a second capacitive coupling effect on the second signal wire that is greater than the first capacitive coupling effect on the first signal wire such that the signal arrives at the first and second receiving components at nearly the same time.

2. The method of claim 1, wherein the network is a clock network, and the signal is a clock signal.

3. The method of claim 1, wherein the network is an H-clock network, and the signal is a clock signal.

4. A device including a network in which the skew is balanced utilizing coupling capacitance, the device comprising:

- at least one sending component, the at least one sending component for sending a signal over a signal wire to one or more receiving components in a network;
- a first receiving component communicatively coupled to the at least one sending component by a first signal wire, the first receiving component being located a first distance along the first signal wire from the at least one sending component in the network;
- a second receiving component communicatively coupled to the at least one sending component by a second signal wire, the second receiving component being located a second distance along the second signal wire from the at least one sending component in the network, wherein in the second distance is less than the first distance;
- a first pair of shielding wires positioned oppositely adjacent the first signal wire at a first offset distance, the first pair of shielding wires for effecting a first capacitive coupling of a signal carried on the first signal wire; and
- a second pair of shielding wires positioned oppositely adjacent the second signal wire at a second offset distance smaller than the first offset distance, the second pair of shielding wires for effecting a second capacitive coupling of the signal carried on the second signal wire greater than the first capacitive coupling of the signal carried on the first signal wire, such that the signal is received at the first and second receiving components at nearly the same time.

5. The device of claim 4, wherein the device is a microprocessor.

6. The device of claim 4, wherein the network is a clock network and the signal is a clock signal.

7. The device of claim 4, wherein the network is an H-clock network and the signal is a clock signal.

8. A method for utilizing coupling capacitance to balance skew in a network, the method comprising:

- designating a first signal path in a network, the first signal path for carrying a signal from a sending component to a first receiving component in the network;
- designating a second signal path in the network, the second signal path for carrying the signal from the sending component to a second receiving component in the network, the second signal path being shorter in distance than the first signal path; and
- effecting a first capacitive coupling effect on the first signal path and a greater second capacitive coupling effect on the second signal path by positioning shielding wires oppositely adjacent each of the first and second signal paths at different offset distances so that a signal carried on the first and second signal paths arrives at the first and second receiving components nearly simultaneously and balances skew in the network.

9. The method of claim 8, wherein effecting a first capacitive coupling effect on the first signal path further comprises:

positioning first and second shielding wires oppositely adjacent the first signal path at a first offset distance.

10. The method of claim 8, wherein effecting a second capacitive coupling effect on the second signal path further comprises:

positioning third and fourth shielding wires oppositely adjacent the second signal path at a second offset distance, the second offset distance being less than the first offset distance.

11. The method of claim 8, wherein the network is a clock network and the signal is a clock signal.

* * * * *